United States Patent [19]

Meier et al.

[11] Patent Number: 5,124,233
[45] Date of Patent: Jun. 23, 1992

[54] PHOTORESIST COMPOSITIONS

[75] Inventors: Kurt Meier, Binningen; Ewald Losert, Rheinfelden, both of Switzerland

[73] Assignee: Ciba-Geigy Corporation, Ardsley, N.Y.

[21] Appl. No.: 202,765

[22] Filed: Jun. 3, 1988

[30] Foreign Application Priority Data

Jun. 12, 1987 [CH] Switzerland ............ 2214/87

[51] Int. Cl.$^5$ ................................. G03C 1/64
[52] U.S. Cl. ................... 430/280; 430/326; 430/327; 430/330
[58] Field of Search ............ 430/280, 327, 330, 326

[56] References Cited

U.S. PATENT DOCUMENTS

| | | |
|---|---|---|
| 3,752,669 | 8/1973 | Abolafia . |
| 4,624,912 | 11/1986 | Zweifel et al. ............ 430/280 |
| 4,693,961 | 9/1987 | Bauer ............ 430/280 |

OTHER PUBLICATIONS

Encyclopedia of Chemical Technology 3rd edition, vol. 10 p. 268.
Derwent Abst. 83-828645/48.
Derwent Abst. 84-296088/48.

*Primary Examiner*—Charles L. Bowers, Jr.
*Assistant Examiner*—Thorl Chea
*Attorney, Agent, or Firm*—Luther A. R. Hall; JoAnn Villamizar

[57] ABSTRACT

Positive-working photoresist compositions containing
(a) an epoxide resin which can be hardened by heat,
(b) a latent urea or imidazole hardener for the component (a) and
(c) an iron-arene complex of the formula (I)

$$[R^1(Fe^{II}R^2)_n]_m^{+n}[X]_n^{-m} \qquad (I)$$

in which n is 1 or 2, m is 1, 2, 3, 4 or 5, X is a non-nucleophilic anion, $R^1$ is a $\pi$-arene and $R^2$ is an anion of a $\pi$-arene, are described.

These compositions are distinguished by good properties towards heat and chemicals and require short exposure times.

11 Claims, No Drawings

PHOTORESIST COMPOSITIONS

The present invention relates to positive-working photoresist compositions and to a process for the production of positive illustrations.

Photoresist compositions are known and are described in numerous publications, for example in DeForest, Photoresist Materials and Processes, McGraw-Hill Book Company, New York, 1975. Photoresists embrace coatings prepared from a solution or coatings applied as a dry film, which, when exposed to light of suitable wavelength, undergo chemical changes affecting their solubility in certain solvents (developers). Two different types are known. The negative-working resist is originally a mixture soluble in its developer, but, after exposure to activating radiation, becomes insoluble in the developer and hence defines a latent image. Customary positive resists work in the opposite manner; exposure renders the resist soluble in the developer.

A positive photoresist composition containing an epoxide resin, a tertiary amine, a halogenated hydrocarbon, dicyandiamide and a solvent is described in German Offenlegungsschrift 2,258,880. The effect of exposing the resin to chemically active radiation is to harden rather slowly the epoxide resin to which amine and halogenated hydrocarbon have thus been added. However, the system described therein does not meet the high requirements in respect of sensitivity which are set for a positive-working photoresist composition.

The present invention relates to positive-working photoresist compositions containing
(a) an epoxide resin which can be hardened by heat,
(b) a latent urea or imidazole hardener for the component (a) and
(c) an iron-arene complex of the formula (I)

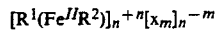
$$[R^1(Fe^{II}R^2)]_n{}^{+n}[x_m]_n{}^{-m} \quad (I)$$

in which n is 1 or 2, m is 1, 2, 3, 4 or 5, X is a non-nucleophilic anion, $R^1$ is a $\pi$-arene and $R^2$ is an anion of a $\pi$-arene.

The polymerized epoxide resins mentioned as the component (a) are, in particular, the diepoxides and polyepoxides and epoxide resin prepolymers of the type used for the preparation of crosslinked epoxide resins. The diepoxides and polyepoxides can be aliphatic, cycloaliphatic or aromatic compounds. Examples of such compounds are the glycidyl ethers and β-methylglycidyl ethers of aliphatic or cycloaliphatic diols or polyols, for example those of ethylene glycol, propane-1,2-diol, propane-1,3-diol, butane-1,4-diol, 1,1,2,3,3-pentahydroxycyclohexane, diethylene glycol, polyethylene glycol, polypropylene glycol, glycerol, trimethylolpropane or 1,4-dimethylolcyclohexane or 2,2-bis-(4-hydroxycyclohexyl)-propane; the glycidyl ethers of diphenols and polyphenols, for example resorcinol, 4,4'-dihydroxydiphenylmethane, 4,4'-dihydroxydiphenyl-2,2-propane, novolaks and 1,1,2,2-tetrakis-(4-hdyroxyphenyl)-ethane.

Further glycidyl compounds of technical importance are the glycidyl esters of carboxylic acids, in particular dicarboxylic and polycarboxylic, acids. Examples of these are the glycidyl esters of succinic acid, adipic acid, azelaic acid, sebacic acid, phthalic acid, terephthalic acid, tetrahydrophthalic acid, hexhydrophthalic acid, isophthalic acid or trimellitic acid, or of dimerized fatty acids.

Examples of polyepoxides other than glycidyl compounds are the diepoxides of vinyl cyclohexene and dicyclopentadiene, 3-(3',4'-epoxycyclohexyl)-8,9-epoxy-2,4-dioxaspiro[5.5]undecane, the 3',4'-epoxycyclohexylmethyl ester of 3,4-epoxycyclohexanecarboxylic acid, butadiene diepoxide or isoprenediepoxide, epoxidized linoleic acid derivatives or epoxidized polybutadiene.

Preferred epoxide resins are diglycidyl ethers, which may be of the so-called advanced type, of dihydric phenols or dihydric aliphatic alcohols having 2 to 4 carbon atoms. Epoxy novolaks, the diglycidyl ethers, which may be of the so-called advanced type, of 2,2-bis-(4-hydroxyphenyl)-propane and bis-(4-hydroxyphenyl)-methane and glycidyl ethers of cresole novolaks are particularly preferred.

The components (a) are known and their selection is not critical, so long as they do not contain functional groups which undergo reactions with the component (c).

The urea or imidazole hardeners employed as the component (b) are also known compounds and many of them are commercially available. The term "latent" is used to clarify that only hardening agents which do not render a hardening reaction possible at low temperatures are intended. For use in accordance with the invention it is advantageous to use hardeners (b) with which the hardening reaction only takes place at an elevated temperature, preferably above 80° C. and especially above 100° C.

Examples of suitable hardeners are imidazole, 1-methylimidazole, 2-methylimidazole, 2-ethyl-4-methylimidazole, 2,4-dimethylimidazole, 2-phenylimidazole, 1-vinyl-2-methylimidazole, 2-chloro-4-(N',N'-dimethylureido)-toluene, 2-(N',N'-dimethylureido)-phenol, 4-(N',N'-dimethylureido)-chlorobenzene etc.

Amongst the latent hardeners, imidazole and derivatives thereof are preferred.

The amount of hardener (b) added is known to those skilled in the art and is usually 0.1-10% by weight, preferably 0.5-5% by weight, relative to the resin (a).

The iron-arene complexes (c) are known compounds. Substances of this type have been described, for example in EP-A 94,915, as photoinitiators for cationically photopolymerizable materials.

Reference should be made to EP-A 126,712, page 3 et seq. for the meaning of the radicals $R^1$ and $R^2$ in the formula I. The meanings of $R^1$ preferred in the present invention are cumene, napthalene, methylnaphthalene, pyrene or stilbene, and cyclopentadienyl for $R^2$.

Examples of X in the formula I are $BF_4{}^\ominus$, $PF_6{}^\ominus$, $AsF_6{}^\ominus$, $SbF_6{}^\ominus$ and $SbF_5OH{}^\ominus$; sulfonates, such as methylsulfonate or p-toluenesulfonate; perfluoroalkylsulfonates, such as trifluoromethylsulfonate or nonafluorobutylsulfonate; acetate, for example $CH_3COO{}^\ominus$; perfluoroacetates, for example $CF_3COO{}^\ominus$; halides, such as $F{}^\ominus$, $Cl{}^\ominus$, $Br{}^\ominus$ or $I{}^\ominus$; and pseudohalides, for example $CN{}^\ominus$, $SCN{}^\ominus$ and others. Sulphonates and perfluoroalkylsulfonates are particularly preferred.

The compositions according to the invention preferably contain 0.5-20% by weight, in particular 1-5% by weight of the component (c), relative to the resin (a).

The compositions according to the invention are distinguished by the fact that the hardenability of exposed areas differs markedly from that of areas not exposed to light. This makes it possible to harden the unexposed areas after heat treatment in such a way that they are substantially insoluble in customary developers, whereas the exposed areas are in a still largely unhardened state, so that they are for practical purposes completely soluble in the same developer. It is possible in this way to obtain positive resists having excellent properties in respect of temperature and chemicals. Surprisingly, hardening by heat at the unexposed areas is not adversely affected and only short exposure times are sufficient for good results.

The present invention also relates to a process for the production of positive images which embraces the following process steps:

coating a substrate with a positive-working photoresist composition containing
(a) an epoxide resin which can be hardened by heat,
(b) a latent urea or imidazole hardener for the component (a) and
(c) an iron-arene complex of the formula (I)

$$[R^1(Fe^{II}R^2)_n]_m{}^{+n}[X]_n{}^{-m} \qquad (I)$$

in which n is 1 or 2, m is 1, 2, 3, 4 or 5, X is a non-nucleophilic anion, $R^1$ is a $\pi$-arene and $R^2$ is an anion of a $\pi$-arene, exposing the coated substrate to actinic radiation using a predetermined pattern
hardening the exposed substrate at an elevated temperature and
developing the substrate and,
if necessary, stripping.

The coated substrates can be prepared, for example, by preparing a solution or suspension of the composition. The choice of solvent and the concentration depend mainly on the nature of the composition and on the coating process. The solution is applied uniformly to a substrate by known coating processes, for example by whirler-coating, dipping, doctorblade coating, curtain coating processes, brushing, spraying, electrostatic spraying and reverse roll coating. It is also possible to apply the light-sensitive layer to a temporary, flexible carrier and then to coat the final substrate, for example a printed circuit board coated with copper, by layer transfer via lamination.

The amount applied (layer thickness) and the nature of the substrate (layer carrier) depend on the desired field of application. It is particularly advantageous that the compositions according to the invention can be employed in layer thicknesses capable of wide variation.

Possible applications for the compositions according to the invention are their use as photoresists for the electronics industry (plating resists or etch resists), solder-stop masks, the production of printing plates, such as offset printing plates for autotype gravure printing or for roller printing and also for the production of screen printing templates, use in chemical milling or use as a microresist in the production of integrated switching circuits.

The possible layer carriers and the processing conditions for the coated substrates vary accordingly.

Examples of materials used for recording information by photographic means are films made of polyester, cellulose acetate or paper coated with plastic; specially treated aluminium is used for offset printing formes and copper-coated laminates or etched printed circuit boards are used for the production of printed circuits. After coating, the solvent is usually removed by drying, leaving a layer of the photoresist on the carrier.

The exposed areas of the photosensitive resist are removed by being dissolved out in a developer after the material has been exposed to light image-wise in the customary manner.

Aqueous alkaline solutions such as are employed for the development of naphthoquinonediazide layers are particularly preferred as the developer. These include, in particular, aqueous solutions of alkali metal silicates, phosphates and hydroxides or tetraalkylammonium compounds. If appropriate, even smaller amounts of wetting agents and/or organic solvents can be added to these solutions.

Typical organic solvents are those which are miscible with water and which can be added to the developer liquids, for example 2-ethoxyethanol or acetone and mixtures of two or more of such solvents.

The term "exposure to actinic radiation using a predetermined pattern" includes not only exposure through a photomask containing a predetermined pattern, for example a diapositive, but also exposure by means of a laser beam which is moved over the surface of the coated substrate, for example under the control of a computer, and in this way produces an image.

The sensitivity to light of the compositions according to the invention extends as a rule from the UV region (approx. 250 nm) to approx. 600 nm and thus covers a very wide range. A large number of very varied types of light sources can therefore be used. Both point sources of light and sheet-like lamps (lamp curtains) are suitable. The following are examples: carbon arc lamps, xenon arc lamps, mercury vapour lamps, if appropriate doped with metal halides (metal-halogen lamps), fluorescent lamps, incandescent argon lamps, electronic flash lamps and photographic floodlight lamps. Depending on the application and the type and strength of the lamp, the distance between the lamps and the image material according to the invention can vary, for example from 2 cm to 150 cm. Laser light sources, for example argon ion lasers or krypton ion lasers with strong emission lines (Ar lasers) at 457, 476, 488, 514 and 528 nm are particularly suitable. With this type of exposure, a photomask in contact with the layer of photopolymer is no longer necessary; the controlled laser beam writes straight onto the layer. The high sensitivity of the materials according to the invention, which permits high writing speeds at relatively low intensities, is very advantageous in this case. Printed circuits in the electronics industry, lithographic offset printing plates or relief printing plates and also photographic image recording materials can be produced by this method.

The hardening of the exposed compositions is carried out by customary methods, for example by heating in convection ovens. The hardening temperature is generally about 80° to 350° C., in particular 100° to 200° C. The hardening time is 1 to 60 minutes, in particular 3 to 30 minutes, depending on the composition and the temperature.

The photoresist compositions according to the invention can, if appropriate, also contain sensitizers for the component (c). The following are examples of these: perylene, 9,10-dichloroanthracene, 9,10-diphenylanthracene, 3,4-benzopyrene, 1-chloroanthracene, 2-methylanthracene, 9-methylanthracene, 2-t-butylanthracene, anthracene, 1,12-benzoperylene, trans-1,3,5-hexatriene, 1,2-benzanthracene, pyrene, pentaphene, diphenyltetraacetylene, transstilbene, 1,2,3,4-dibenzanthracene, 1,2,5,6-dibenzanthracene, 1,3-cyclohexadiene, 1,2,7,8-dibenzanthracene, 1,2-benzopyrene, fluoroanthene, 1,2-benzochrysene, tetraacetylene glycol, diethyltetraacetylene, 1-aminonaphthalene, benzil, coronen, 1-nitronaphthalene, 3,4-benzofluorene, diphenyltriacetylene, 2,2'-binaphthyl, 1-naphthaldehyde, 5,6-benzochrysen, 1-acetylnaphthalene, 3,4,5,6-dibenzophenanthrene, cisstilbene, 2,3-butanedione, chrysene, 1,2-benzofluorene, 2,3-benzofluorene, 1-benzoylnaphthalene, 1-naphthonitrile, naphthalene-1-carboxylic acid, diphenyldiacetylene, 1,2,6,7-dibenzopyrene, cyclopentadiene, 9-acetylphenanthrene, p-terphenyl, 1-naphthol, 1-iodonaphthalene, 2-phenylnaphthalene, 3,4-benzophenanthrene, 3-acetylphenanthrene, 1-bromonaphthalene, 1-chloronaphthalene, 2-naphthonitrile, acenaphthene, trans-1,3-pentadiene, 2-naphthaldehyde, naphthalene-2-carboxylic acid, 2-acetylnaphthalene, 2-benzoylnaphthalene, 2,4-hexadiene-1-ol, 1-methylnaphthalene, 1-methoxynaphthalene, 1,3-butadiene, 1-fluoronaphthalene, isoprene, 2-iodnaphthalene, 2-bromonaphthalene, 2-chloronaphthalene, 2-naphthol, 4-phenylbenzophenone, 4-phenylacetophenone, 2-methylnaphthalene, naphthalene, o-terphenyl, styrene, phenanthrene, 4,4'-bis-dimethylaminobenzophenone, diphenylacetylene, anthraquinone, 4,4'-dichlorobiphenyl, triacetylene glycol, 4-hydroxybiphenyl, 2,4,6-octatriyn, m-terphenyl, 2-bromobiphenyl, thioxanthone, 2-isopropylthioxanthone, 2-chlorothioxanthone, 2-dodecylthioxanthone, 1-methoxycarbonylthioxanthone, 2-ethoxycarbonylthioxanthone, 3-(2-methoxyethoxycarbonyl)thioxanthone, 4-butoxycarbonylthioxanthone, 1-cyano-3-chlorothioxanthone, biphenyl, 3,4-methylenedioxyacetophenone, 4-cyanobenzophenone, triphenylene, 4-benzoylpyridine, 2-benzoylpyridine, fluorene, 4,4'-dichlorobenzophenone, 4-trifluoromethylbenzophenone, 3-methoxybenzophenone, 4-chlorobenzophenone, 3-chlorobenzophenone, 4,4'-dibromobenzophenone, 3-benzoylpyridine, 4-methoxybenzophenone, 3,4-dimethylbenzophenone, 4-methylbenzophenone, benzophenone, 2-methylbenzophenone, 4,4'-dimethylbenzophenone, 2,5-dimethylbenzophenone, 2,4-dimethylbenzophenone, 4-cyanoacetophenone, 4-fluorobenzophenone, o-benzylbenzophenone, α-chloroacetophenone, diphenylene oxide, carbazole, 4,4'-dimethoxybenzophenone, 4-acetylpyridine, 3,4,5-trimethylacetophenone, p-dicyanobenzene, 4-methoxybenzaldehyde, 4-methylbenzaldehyde, 3,5-dimethylacetophenone, 4-bromoacetophenone, 4-methoxyacetophenone, 3,4-dimethylacetophenone, benzaldehyde, triphenylmethylacetophenone, anthrone, 4-chloroacetophenone, 4-trifluoromethylacetophenone, phenylacetylene, 2,4,6-trimethylacetophenone, 3-methoxyacetophenone, 3-methylacetophenone, o-dicyanobenzole, 1-tetralone, 3-bromoacetophenone, 4-methylacetophenone, 3-cyanoacetophenone, 3-trifluoromethylacetophenone, hexachlorobenzole, xanthone, acetophenone, 2-phenylbutyrophenone, allylacetophenone, β-phenylpropionphenone, valerophenone, propiophenone, butyrophenone, 2-ethoxycarbonyl-3-nitrothioxanthone, 3-thiophenylphthalimide, and N-methyl-4-thiophenylphthalimide.

Anthracenes, phthalimide thioethers and especially thioxanthones are preferred. These are preferably added in an amount of 0.2–10% by weight, preferably 0.5–5% by weight, relative to the epoxide resin.

If aqueous alkaline development is desired, the resist compostion according to the invention can contain a binder, for example a polyphenol or a mixture of polyphenols, i.e. a polymer having a specific content of phenolic hydroxyl groups. This content should at least be sufficiently high to ensure development, or at least swelling, in an aqueous alkaline solution of developer.

Suitable film-forming binders, soluble in aqueous alkaline solutions can be classified in the following groups:

i) novolaks formed from at least one phenol and at least one aldehyde, ii) homopolymers and copolymers of alkenylphenols and, in particular, iii) homopolymers and copolymers of N-hydroxyphenylmaleinimides.

Preferred novolaks i) are compounds derived from a $C_1$–$C_6$aldehyde, for example formaldehyde and acetaldehyde, and from a mononuclear, substituted or unsubstituted phenol. Examples of preferred phenols are phenol itself or phenols substituted by one or two $C_1$–$C_9$alkyl groups, for example o-, m- or p-cresol, xylenol, p-tert-butylphenol and o-, m- or p-nonylphenol, or phenols substituted by one or two halogen atoms, preferably chlorine or bromine, for example p-chlorophenol, phenols substituted by a phenyl nucleus, for example p-phenylphenol, or phenols containing more than one phenolic group, for example resorcinol, bis-(4-hydroxyphenyl)-methane or 2,2-bis-(4-hydroxyphenyl)-propane.

Preferred homopolymers or copolymers of alkenylphenols ii) are, in particular, the compounds of the formula II

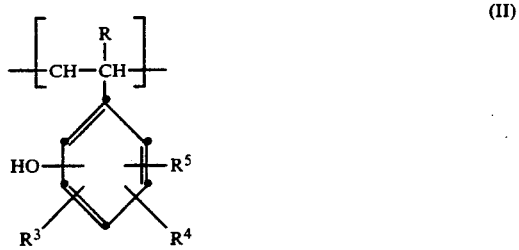

in which R is hydrogen or methyl and $R^3$, $R^4$ and $R^5$ independently of one another are hydrogen, $C_1$–$C_4$alkyl, $C_1$–$C_4$alkoxy, halogen, in particular chlorine or bromine, and methylol. The phenolic hydroxyl group is located in the o-, m- or p-position relative to the alkenyl group, but is preferably in the p-position.

Examples of suitable comonomers are vinyl monomers free from carboxyl groups. Examples of such monomers are styrene, acrylic and methacrylic acid esters, in particular methyl (meth)acrylates or 2-hydroxyethyl (meth)acrylates, acrylamide, vinyl acetate and N-substituted maleimides.

The proportion of comonomer in the binder of type ii) is preferably 0–50 mol %, relative to the whole of the polymer.

Polymers of type ii) are known and are described, for example, in German Offenlegungsschriften 2,322,230 and 3,406,927. In some cases polymers of this type are also commercially available.

Preferred binders of type iii) are homopolymers of N-hydroxyphenylmaleimides. These are, particularly preferably, homopolymers containing the structural unit of the formula III

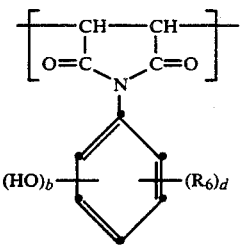 (III)

in which $R^6$ is $C_1$-$C_4$alkyl, $C_1$-$C_4$alkoxy or halogen, in particular chlorine or bromine, b is 1, 2 or 3, d is 0, 1, 2, 3 or 4 and the sum of b and d is not more than 5, it being possible for the radicals $R^6$ of a phenyl nucleus to be of different kinds, within the definitions given.

A further preferred group of binders of type iii) is formed by copolymers based on N-hydroxyphenylmaleimides, in particular those containing structural elements of the formula III and vinyl compounds free from carboxyl groups.

The following are examples of suitable vinyl comonomers:

a) styrene types, for example styrene, α-methylstyrene, p-methylstyrene or p-hydroxyphenylstyrene;
b) esters or amides of α,β-unsaturated acids, for example methyl acrylate, acrylamide, the corresponding methacrylic compounds or methyl maleate;
c) nitriles of α,β-unsaturated acids, for example acrylonitrile or methacrylonitrile;
d) halogen-containing vinyl compounds, for example vinyl chloride, vinyl fluoride, vinylidene chloride or vinylidene fluoride;
e) vinyl esters, for example vinyl acetate or
f) vinyl ethers, for example methyl vinyl ether or butyl vinyl ether.

The content of vinyl component is usually 0 to 95 mol %, preferably 0-75 mol % and particularly preferably 0-50 mol %, relative to the total content of monomer units.

Homopolymers composed of structural units of the formula III and copolymers with vinyl compounds are known and are described, for example, in Belgian Patent Specification 613,801 and in Kobunshi Kagaku, 1969, 26 (292). Turner et al. in the Photopolymer Conference, Ellenville October 1985, pages 35-47 also describe the use of such comonomers with vinyl compounds as binders in positive photosensitive resists.

A further particularly preferred group of binders of type iii) is formed by copolymers based on N-hydroxymaleimides, in particular those containing structural elements of the formula III, allyl compounds and, if appropriate, further vinyl compounds.

These compounds are, in particular, copolymers containing 30-100 mol %, the whole of the polymer, of structural units of the formula III as defined above, and of the formula IV, the proportion of radicals of the formula III, relative to the total proportion of III and IV, being 5 to 95 mol %

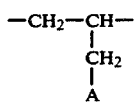 (IV)

in which A is selected from the group of radicals consisting of halogen, cyano or structural units of the formulae V to X

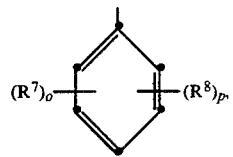 (V)

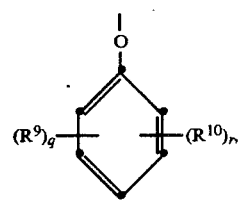 (VI)

 (VII)

 (VIII)

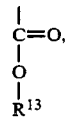 (IX)

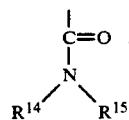 (X)

in which $R^7$ and $R^9$ independently of one another are hydroxyl or glycidyl groups of the formula XIa or XIb

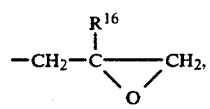 (XIa)

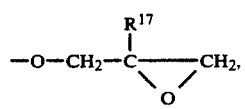 (XIb)

$R^8$ and $R^{10}$ independently of one another are $C_1$-$C_4$alkyl, $C_1$-$C_4$alkoxy or halogen, o and q independently of one another are 0, 1, 2 or 3, p and r independently of one another are 0, 1, 2, 3, 4 or 5, the totals o+p and q+r being not more than 5, $R^{11}$ is hydrogen, $C_1$-$C_{20}$alkyl, a glycidyl radical of the formula XIa or a radical of the formula VIII, $R^{12}$ is hydrogen, $C_1$-$C_{20}$alkyl, cycloalkyl having 5 to 7 ring C atoms, phenyl, naphthyl or benzyl, $R^{13}$ is hydrogen, $C_1$-$C_{20}$alkyl or a glycidyl radical of the formula XIa and the groups $R^{14}$ and $R^{15}$ independently of one another are hydrogen, $C_1$-$C_{20}$alkyl, cycloalkyl having 5 to 7 ring C atoms, aryl or aralkyl each of which is substituted or unsubstituted or a glycidyl radical of the formula XIa, or, together with the common nitrogen atom, form a five-membered or six-membered heterocyclic ring, and $R^{16}$ and $R^{17}$ independently of one another are hydrogen or methyl, it being possible for the radicals $R^7$ to $R^{17}$ and A of a polymer molecule to be of different kinds within the definitions given.

Binders of type iii) which are particularly preferred are copolymers containing 50-100 mol %, relative to the whole of the polymer, of structural units of the formulae III and IV.

Binders of type iii) which are especially preferred are those consisting essentially of structural elements of the formulae III and IV in which the content of the elements III is 10-80 mol %, relative to the content of III and IV.

Binders of type iii) which are very particularly preferred are copolymers containing structural units of the formulae III and IV, as defined above, in which A is selected from the group of radicals of the formulae V, VI, VII, IX and X, $R^7$ and $R^9$ are glycidyl groups of the formulae XIa or XIb, $R^{11}$, $R^{13}$ and at least one of the radicals $R^{14}$ or $R^{15}$ are a glycidyl group of the formula XIa and o and q independently of one another are 1, 2 or 3.

Binders of type iii) which are particularly preferred are those containing structural units of the formulae III and IV, as defined above, in which A is a group of the formula VII and $R^{11}$ is a group of the formula XIa or in which A is a group of the formulae V or VI, $R^7$ and $R^9$ are glycidyl groups of the formula XIb, o and q are 1 or 2 and p and r are 0.

Further binders of type iii) are copolymers containing at least 50 mol %, relative to the whole of the polymer, of structural elements of the formula III or IV and containing, as the residual component, structural elements derived from vinyl compounds free from carboxyl groups and selected from the group consisting of styrene types, esters or amides of $\alpha,\beta$-unsaturated acids, nitriles of $\alpha,\beta$-unsaturated acids, halogen-containing vinyl compounds, vinyl esters and vinyl ethers.

If development is carried out with an organic solvent, the solvents used are those in which the epoxide resins used are soluble. This process step can be mechanized and can be carried out, for example, by means of a spray development device or continuous development device. Development merely by wiping over or by treatment with solvent vapour is also possible.

Suitable organic solvents are polar solvents, especially polar, aprotic solvents, and can be used on their own or as mixtures composed of at least two solvents. The following are examples of suitable solvents: ethers, such as diethyl ether, dibutyl ether, tetrahydrofuran, dioxane, methyl ethylene glycol, dimethyl ethylene glycol, dimethyl diethylene glycol, diethyl diethylene glycol, dibutyl diethylene glycol or dimethyl triethylene glycol, halogenated hydrocarbons, such as methylene chloride, chloroform, carbon tetrachloride, 1,2-dichloroethane, 1,1,2-trichloroethane or 1,1,2,2-tetrachloroethane, carboxylic acid esters and lactones, such as propylene carbonate, ethyl acetate, methyl propionate, ethyl benzoate, ethylglycol acetate, 2-methoxyethyl acetate, $\gamma$-butyrolactone, $\gamma$-valerolactone and mevalolactone, sulfoxides, such as dimethyl sulfoxide or tetramethyl sulfoxide, sulfones, such as dimethyl sulfone, diethyl sulfone, trimethylene sulfone or tetramethylene sulfone, ketones, such as dimethyl ketone, methyl ethyl ketone, methyl isobutyl ketone and cyclohexanone, and substituted benzenes, such as chlorobenzene and nitrobenzene.

The compositions according to the invention can also contain other additives customary in the art. Examples of these are pigments, dyes, wetting agents, flow-control agents, stabilizers, fillers, thixotropic agents, adhesion promoters, plasticizers and binders.

The following examples illustrate the invention in greater detail:

EXAMPLE 1

A mixture consisting of 4 g of an industrial epoxide cresol novolak (epoxide content 4.5 equivalents/kg), 1 g of talc, 0.04 g of Irgalith® green pigment, 0.12 g of ($\eta^6$-anisole) ($\eta^5$-cyclopentadienyl)iron(II) hexafluorophosphate, 0.05 g of 2-methylimidazole and 5 g of cyclohexanone is applied to a copper-coated epoxide panel by means of a 100 wire doctor-blade and is dried at 80° C.

The photopolymer panel prepared in this way is exposed to a 5,000-watt high-pressure mercury vapour lamp, at a distance of 50 cm from the sample platform, a 21-step Stouffer sensitivity guide being used as a pattern (see W. S. DeForest, Photoresist, McGraw-Hill Book Company, N.Y., page 109 et seq). The exposure time is 15 seconds, the exposed panel is then hardened at 140° C. for 15 minutes. Development is carried out in cyclohexanone, the exposed portions being dissolved. This results in a relief image in which step No. 3 is the last completely dissolved step.

EXAMPLE 2

Example 1 is repeated, but with ($\eta^6$-isopropylbenzene) ($\eta^5$-cyclopentadienyl)-iron(II) trifluoromethanesulfonate instead of ($\eta^6$-anisole)-($\eta^5$-cyclopentadienyl)-iron(II) hexafluorophosphate and with 0.06 g of 9-isopropylthioxanthone added as sensitizer. After an exposure of 5 seconds and hardening for 5 minutes at 150° C., this results in a relief image in which the last step completely dissolved is 2.

EXAMPLE 3

A mixture consisting of 12 g of a technical epoxide cresole novolak (epoxide content 4.5 equivalents/kg), 5 g of a technical bisphenol A epoxide resin (epoxide content 0.5 equivalents/kg), 2 g of talc, 0.06 g of Irgalith® green pigment, 0.2 g of ($\eta^6$-stilbene)($\eta^5$-cyclopentadienyl)-iron(II) tosylate, 0.05 g of 2-ethyl-4-methylimidazole and 7.5 g of 1-methoxy-2-propanol is applied to a copper-coated epoxide panel by means of a 100$\mu$ wire doctor-blade. The film, which initially is wet, is dried at 80° C.

Exposure, 10 seconds, hardening, 30 minutes at 130° C., and development with 1-methoxy-2-propanol are carried out as in Example 1. This results in a relief image in which step No. 5 is the last step completely dissolved.

EXAMPLE 4

The photopolymer mixture of Example 3 is applied to polyester sheeting by means of a 100$\mu$ wire doctor-blade and the initially wet film is dried at 80° C. The solid resist film is transferred to a preheated, copper-coated epoxide panel by means of a laminator at 110° C. and, after cooling, is exposed, hardened and developed as described in Example 3. This also results in a relief image in which step No. 5 is the last step completely dissolved.

EXAMPLE 5

The photopolymer mixture of Example 3 is applied to a printed circuit board by means of a 100μ wire doctor-blade, and the initially wet film is dried at 80° C. Exposure is carried out using the illumination apparatus described in Example 1 for 10 seconds through a mask which leaves the soldering lugs free. Hardening and development are carried out as in Example 1. The board is coated with flux (a solution of 26 g of pure colophony in 100 ml of isopropanol) and is placed, with the coating downwards, on a soldering bath heated to 270° C. (consisting of 50% of lead and 50% of tin). The board is removed from the soldering bath after 10 seconds, cooled, freed from flux by washing with isopropanol and dried with compressed air.

Result: The coating does not display any kind of visible alteration, such as cracks, bubbles, pores or adhering residues of tin/lead.

EXAMPLE 6

A mixture consisting of 4.8 g of a technical poly-p-vinylphenol (MW 1,000), 2.8 g of bisphenol A diglycidyl ether, 0.2 g of ($\eta^6$-stilbene)-($\eta^5$-cyclopentadienyl)-iron(II) tosylate, 0.1 g of 1-vinylimidazole, 0.016 g of Maxilonorot ® pigment, 4 g of methyl ethyl ketone and 4 g of methylcellosolve is applied to a copper-coated epoxide panel by means of a 100μ wire doctor-blade and is dried at 80° C.

After exposure for 15 seconds, hardening for 5 minutes at 120° C., this results in a relief image in which the last completely dissolved step is 5 (developer: a solution of 37.5 g of sodium metasilicate pentahydrate and 0.2 g of Supronic B50, ABM Chemicals Ltd., in 1 liter of water).

EXAMPLE 7

A solution consisting of 6 g of a techincal epoxide cresole novolak (epoxide content 4.5 equivalent/kg), 3 g of a technical bisphenol A epoxide resin (epoxide content 0.5 equivalents/kg), 0.2 g of ($^6$stilbene) ($\eta^5$-cyclopentadienyl)-iron(II) tosylate, 0.076 g of 2-(N',N'-dimethylureido)-phenol, 3 g of 1-methoxy-2-propanol and 6 g of cyclohexanone is applied to a copper-coated epoxide panel by means of a 100μ wire doctor-blade. The initially wet film is dried at 80° C.

Exposure, 30 seconds, hardening, 30 minutes at 135° C., and development in cyclohexanone are carried out as in Example 1. This results in a relief image in which the last completely dissolved step is 9.

EXAMPLE 8

Example 7 was repeated, replacing the 2-(N',N'-dimethylureido)-phenol by 0.126 g of 2-chloro-4-(N',N'-dimethylureido)-toluene. This results in a relief image in which the last completely dissolved step is 9.

What is claimed is:

1. A positive-working photoresist composition containing
   (a) an epoxide resin which can be hardened by heat,
   (b) a latent urea or imidazole hardener for the component (a) and
   (c) an iron-arene complex of the formula (I)

$$[R^1(Fe^{II}R^2)_n]_m{}^{+n}[X]_n{}^{-m} \qquad (I)$$

in which n is 1 or 2, m is 1, 2, 3, 4 or 5, X is a non-nucleophilic anion, $R^1$ is a π-arene and $R^2$ is an anion of a π-arene.

2. A composition according to claim 1, wherein the component (b) is a hardener by means of which the hardening reaction takes place at a temperature above 80° C.

3. A composition according to claim 1, wherein the component (b) is imidazole or an imidazole derivative.

4. A composition according to claim 1, containing 0.1–10% by weight, relative to the resin (a), of the component (b).

5. A composition according to claim 1, containing, as the component (c), complexes of the formula I in which X is $BF_4{}^\ominus$, $PF_6{}^\ominus$, $AsF_6{}^\ominus$, $SbF_6{}^\ominus$, or $SbF_5OH^\ominus$; sulfonates, such as methylsulfonate or p-toluenesulfonate; perfluoroalkylsulfonates, such as trifluoromethylsulfonate or nonafluorobutylsulfonate; acetate, for example $CH_3COO^-$; a perfluoroacetate, $F^\ominus$, $Cl^\ominus$, $Br^\ominus$ or $I^\ominus$; or a pseudohalide.

6. A composition according to claim 5, wherein X is sulfonate or a perfluoroalkylsulfonate.

7. A composition according to claim 1, containing 0.5–20% by weight, relative to the resin (a), of the component (c).

8. A composition according to claim 1, containing, in addition, a sensitizer for the component (c).

9. A composition according to claim 1, containing a binder for development under aqueous alkaline conditions.

10. A composition according to claim 9, containing, as the binder, a polyphenol or a mixture of polyphenols.

11. A process for the production of positive images comprising the following process steps:
    coating a substrate with a positive-working photoresist composition containing
    (a) an epoxide resin which can be hardened by heat,
    (b) a latent urea or imidazole hardener for the component (a) and
    (c) an iron-arene complex of the formula (I)

$$[R^1(Fe^{II}R^2)_n]_m{}^{+n}[X]_n{}^{-m} \qquad (I)$$

in which n is 1 or 2, m is 1, 2, 3, 4 or 5, X is a non-nucleophilic anion, $R^1$ is a π-arene and $R^2$ is an anion of a π-arene,
    exposing the coated substrate to actinic radiation using a predetermined pattern
    hardening the exposed substrate at an elevated temperature and
    developing the substrate.

* * * * *